United States Patent
Coenen

(10) Patent No.: US 7,429,797 B2
(45) Date of Patent: Sep. 30, 2008

(54) ELECTRONIC DEVICE AND CARRIER SUBSTRATE

(75) Inventor: Martinus Jacobus Coenen, Eindhoven (NL)

(73) Assignee: NXP B.V., Eindhoven (NL)

( * ) Notice: Subject to any disclaimer, the term of this patent is extended or adjusted under 35 U.S.C. 154(b) by 246 days.

(21) Appl. No.: 10/574,881

(22) PCT Filed: Oct. 1, 2004

(86) PCT No.: PCT/IB2004/051946

§ 371 (c)(1),
(2), (4) Date: Apr. 6, 2006

(87) PCT Pub. No.: WO2005/036644

PCT Pub. Date: Apr. 21, 2005

(65) Prior Publication Data

US 2007/0040270 A1    Feb. 22, 2007

(30) Foreign Application Priority Data

Oct. 10, 2003    (EP)    ................................ 03103757

(51) Int. Cl.
*H01L 23/48*    (2006.01)

(52) U.S. Cl. .................. 257/778; 257/691; 257/693; 257/738; 257/773; 257/776; 257/780; 257/781; 257/784; 257/786; 257/E23.06; 257/E23.079; 257/E23.153; 257/E23.001; 257/E23.015; 257/E23.02

(58) Field of Classification Search ............... 257/691, 257/693, 698–724, 733–786, E23.001, E23.015, 257/E23.02, E23.06, E23.079, E23.153
See application file for complete search history.

(56) References Cited

U.S. PATENT DOCUMENTS

| 5,900,312 | A | * | 5/1999 | Sylvester | ................. 428/322.7 |
| 6,388,207 | B1 | * | 5/2002 | Figueroa et al. | ............. 174/262 |
| 6,608,379 | B2 | * | 8/2003 | Yeo et al. | ..................... 257/706 |
| 6,717,066 | B2 | * | 4/2004 | Vandentop et al. | .......... 174/260 |
| 6,800,947 | B2 | * | 10/2004 | Sathe | ........................ 257/780 |
| 7,253,516 | B2 | * | 8/2007 | Coenen | ..................... 257/724 |
| 2003/0038378 | A1 | * | 2/2003 | Jacobs | ........................ 257/783 |
| 2004/0238942 | A1 | * | 12/2004 | Chakravorty et al. | ........ 257/700 |

* cited by examiner

*Primary Examiner*—Jasmine J Clark
(74) *Attorney, Agent, or Firm*—Peter Zawilski

(57) ABSTRACT

Consistent with an example embodiment, an electronic device comprises a semiconductor device, particularly an integrated circuit, and a carrier substrate with conductive layers on the first side and the second side, and voltage supply and ground connections mutually arranged according to a chessboard pattern. These connections extend in a direct path through vertical interconnects and bumps to bond pads at the integrated circuit, which bond pads are arranged in a corresponding chessboard pattern. As a result, an array of direct paths is provided, wherein the voltage supply connections form as much as possible the coaxial center conductors of a coaxial structure.

11 Claims, 4 Drawing Sheets

ELECTRONIC DEVICE AND CARRIER SUBSTRATE

The invention relates to an electronic device comprising:

a semiconductor device provided with a plurality of bond pads, of which bond pads a first portion is defined for ground connection and a second portion is defined for voltage supply and a third portion is defined for signal transmission, and— a carrier substrate comprising a layer of dielectric material and having a first side and an opposed second side, which are each provided with an electrically conductive layer, on which first side bond pads are present corresponding to the bond pads of the semiconductor device, and on which second side contact pads for external coupling are provided, the contact pads and the bond pads being electrically interconnected according to a desired pattern, the contact pads being subdivided into a first, a second and a third portion corresponding to the portions of the semiconductor device, the first and second portions of the bond pads being present laterally in an inner area and the third portion being present in an outer area laterally around the inner area.

The invention also relates to such a carrier substrate.

Such an electronic device and such a carrier substrate are known from U.S. Pat. No. 6,448,639. The known device is known as a ball grid array package. This type of package is well known for a variety of integrated circuits, and has as main advantages: easy placement on an external carrier with solder balls, and the ability to provide a very large number of contact pads, and thus very many signal connections, generally known as I/O paths.

The known carrier substrate is provided with two electrically conducting layers, which has the advantage of reducing the cost price of such a package. The first and second portions of the contact pads for ground and voltage supply connection are disposed right under the corresponding bond pads on the first side of the carrier substrate. These bond pads are embodied as concentric ground and power rings, which are coupled with bond wires to the bond pads of the semiconductor device. Due to this construction the connections between the bond pads and the corresponding contact pads are short, which leads to an improved electrical and thermal performance.

It is a drawback of the known device that the ground bounce voltage is still rather high. This ground bounce voltage is defined as the dynamic voltage difference between a ground plane in an external carrier to which the electronic device is attached and the ground connection in the semiconductor device. The higher the ground bounce voltage, the smaller the difference between voltage supply and ground voltage in the semiconductor device, and thus the smaller the margin of operation. This smaller margin of operation will increase the sensitivity to external disturbances and gets more critical with advances in semiconductor technology. The smaller the channel length, the smaller the margin of operation is anyway. Alternatively the ground bounce voltage could be levelled by a higher voltage supply, but this leads to a higher than required thermal dissipation. Moreover, the problem is not resolved thereby, as the problem with the ground bounce voltage is that it is unpredictable.

In other words, it is a first object of the invention to provide an electronic device of the kind mentioned in the opening paragraph having a reduced ground bounce voltage.

It is a second object of the invention to provide a carrier substrate that is suitable for use in the device of the invention.

The first object is achieved in that the semiconductor device is coupled to the carrier substrate in a flip-chip orientation. The bond pads and the contact pads for voltage supply and ground connection are located correspondingly, so as to provide a direct path from the contact pads at the substrate to the corresponding bond pads of the semiconductor device. Furthermore, the pads of the first and second portions are arranged such that at least one direct path dedicated to voltage supply connection acts as a coaxial center conductor.

The device of the invention has the merit that voltage supply connections are present as coaxial structures. As a result, the effective inductance for each of these power paths is reduced by the mutual inductance between the power—or voltage supply—and ground. This results in the desired lower ground bounce voltage. The effect of the coaxial structure is substantial; the effective inductance of the ground path can be lowered by more than 50%.

It is an advantage of the present structure, that the bond pads of the voltage supply connection on the first side of the carrier substrate can be made in the conductive layer present there. In other words, no additional redistribution layer is needed, and a substrate with conductive layers on the opposite sides only can be used. This results in cost reduction in comparison with a carrier substrate with internal conductors.

In an advantageous embodiment, the bond pads of the first and second portion form a joint array, having an edge and an inner area, and the bond pads of the second portion at the edge are provided with ESD protection structures, the bond pads of the second portion in the inner area being free of such ESD protection structures. As the conductivity of the power path is good enough, the voltage gradient shall be minimal during an ESD stress. Hence, the number of ESD protection structures can be limited.

In a further modification, the pads for ground and supply connection are arranged according to a chessboard pattern. This has first of all the advantage that the resulting structure is miniaturized. The contact pads can thus be of a size suitable for assembly to a printed circuit board, while at the same time the dimensions of the semiconductor device need not be increased.

Particularly for this modification, the bond pads at the semiconductor device will be distributed in a regular pattern which covers the complete surface area They are thus also provided on top of the active area The mechanical support of the bond pads may therefore be strengthened, for instance in that the bond pads are present on top of the passivation layer. However, this is not considered necessary in any case. In any case, there is no need for staggered pads at the edge of the semiconductor device. Furthermore, a single ring of bond pads for signal transmission (I/O pads) may be used, which reduces the complexity at once.

It is a first advantage of the chessboard pattern that sufficient pads can be assigned for the voltage supply of the semiconductor device, and particularly the core functionality thereof. An array of 10 by 10 pads provides sufficient power for the use of DC currents of more than 4 Ampère in integrated circuits with a channel length of 0.12 µm. It is a second advantage of the chessboard pattern that the IR drop can be minimized, and will be determined by the semiconductor device. The upper metals of the interconnect structure in an integrated circuit have a smaller thickness than those at the carrier substrate. Hence, the losses at the substrate are lower. It turns out that this holds if the voltage supply and ground connections are distributed equally over the inner area of the carrier substrate, hence that there is a chessboard pattern with equal conditivity in the two orthogonally directed, lateral directions.

The IR drop is particularly relevant for advanced IC processes. An IR drop of 10% was allowed for old CMOS processes, whereas it is only 5% for advanced IC processes with a channel length of 0.18 µm or less. However, the average supply current increases on decreasing the supply voltage for those advanced IC processes. By parallel switching of the package interconnect, at least for the core, the IR drop on the IC is diminished.

In a further embodiment the layer of dielectric material extends from the first to the second side in the substrate. In other words, use is made of a dielectric substrate. This leads to cost reduction. The material of the substrate can thus be a suitable material such as polyimide, polymer-strengthened glass fibers, FR-4 (an epoxy resin), FR-5 and BT-resin. Alternative materials include such materials filled with particles with a relatively high dielectric constant (such as perowskite type materials), ceramic materials including $SiO_2$, Al—C—O—N, materials obtainable by sintering a matrix of thermally conductive material with embedded semiconductor particles. Particularly the combination of matrix materials and embedded particles is preferred, as this allows optimization of a range of parameters, including the dielectric constant, the coefficient of thermal expansion, the mechanical strength and the thermal conductivity. Examples are given in WO01/15182, EP-A 743929, EP03075079.8 (PHNL030040, not prepublished). The choice of the material is rather wide, as no internal conductors are needed.

In a further embodiment, the bond pads of the third portion and the corresponding contact pads for external coupling are interconnected through interconnects defined in the conductive layer on the first side of the carrier substrate, and through vertical interconnects through the carrier substrate which, in the case of perpendicular projection on the conductive layer on the second side, have a substantial overlap with the contact pads for signal transmission. This embodiment is particularly suitable to reduce the complexity of the carrier substrate. Additionally, it allows some further modifications that are beneficial:

In a first modification use is made of different supply voltages for different parts of the semiconductor device. Particularly, the semiconductor device can be divided into the core functionality and the peripheral functionality. The inner area of the substrate is then used for the voltage supply and ground connection to the core. The outer area is used for the signal transmission, the voltage supply and the ground connection to the periphery. The division of a semiconductor device, and particularly an integrated circuit, into core and periphery is suitable for all ICs to limit thermal dissipation and for mixed-signal ICs in particular.

In a further modification hereof, the contact pads in the peripheral area are defined in subgroups, each subgroup comprising one contact pad for voltage connection or one contact pad for ground connection, and several contact pads for signal transmission, all of the pads for signal transmission having the contact pad for either voltage or ground connection as a neighbouring pad. Particularly, the contact pad for voltage or ground connection will be the center ground pad of the group. This subdivision into subgroups allows that there is a minimum distance between a signal path in one direction and a signal path in the reverse direction (the contact pad for either ground or voltage supply). Such a subdivision is particularly important to enforce a proper transmission path from the carrier substrate to an external carrier. Its implementation is thus needed at the level of the solder balls for placement of the device on an external carrier, and hence in the contact pads on the second side of the carrier substrate.

In a second modification, a ground plane is defined in the conductive layer on the second side of the carrier substrate, and the mutual distance between the interconnects and the dielectric thickness of the carrier substrate is chosen such that the interconnects have transmission line characteristics. Any impedance losses at the signal transmission are thus substantially limited.

In a third modification, both modifications are applied and additionally the periphery is provided with an additional on-chip decoupling capacitor. In this manner the communication between the core functionality and the peripheral functionality is optimized.

In another modification a mechanical stiffner layer is present on the first side of the carrier substrate. This solution allows a further reduction of the thickness of the dielectric layer, while not distorting the transmission line character of the interconnects. The transmission line character of the interconnects leads to a reduction of the thickness of the carrier substrate to 100 or 50 µm or potentially even less to obtain the desired transmission line characteristics. In order that the device nevertheless has the desired mechanical stability an encapsulation could be applied. This is, however, not preferred for reasons of thermal management. The use of a dielectric stiffner, which leaves the bond pads on the first side exposed, is a practical solution. It is preferred but not necessary that the dielectric stiffner is made from the same material as the dielectric material of the carrier substrate. Dependent on the stiffner material used an additional spacer may be needed to maintain the transmission line characteristics.

In a further embodiment a spacer layer is present on the first side of the carrier substrate, which spacer layer is covered by a heat dissipation layer, which heat dissipation layer is in thermal contact with the semiconductor device at a face thereof opposite to the face comprising the bond pads. This is an option to improve the thermal management of the device of the invention. It may well be that the spacer is formed by the mechanical stiffner layer.

In a modification hereof, the heat dissipation layer is connected thermally to a heat sink at the carrier substrate. The presence of a heat dissipation layer is not sufficient in itself to improve the thermal management, as it has turned out that the passive cooling at the interface of such heat dissipation layer and air is not very high. To improve this, active cooling could be used, such as heat pipes, which however have the disadvantage of being large. Preferred is therefore the provision of a heat connection to a heat sink at the carrier substrate. The heat connection may include a component that is assembled to the carrier substrate, as is the semiconductor device. Alternatively, use can be made of thin and thick film techniques, for instance in that a throughhole is provided in the spacer. The heat sink of the substrate may be embodied as the ground plane on the second side of the substrate.

In an even further embodiment the device is further provided with a supply series inductor. Such a series inductor preferably has a magnitude in the range of 0.5 to 1.0 µH. It is a favorable implementation to sustain operation over a clock period. Preferably, the inductor is provided as a discrete component at the external carrier, and more preferably within an area corresponding to the core area. Alternatively, the inductor can be integrated in either the external carrier or the carrier substrate. Preferably, the dielectric material is then suitably provided with magnetic particles, for instance of a ferrite material, such as to enhance this inductance.

It is observed that the electronic device of the invention comprises at least one semiconductor device. Generally, this semiconductor device is an integrated circuit Alternatively, more than one semiconductor device may be provided, such as an integrated circuit and diodes; an amplifier and a transceiver; an amplifier and other RF components such as filters and antenna switches; or a first and a second integrated circuit. In the case of two integrated circuits, the core functionality may be present in the first integrated circuit, and the peripheral functionality may be present in the second integrated circuit.

In a further embodiment of the invention, a second electric device is present, which electric device is provided with a direct path for ground and voltage supply connection from its bond pads to the second side of the carrier substrate, on which second side contact pads for ground and voltage supply connection are present. The construction enabling direct provision of voltage supply and ground to a semiconductor device can be repeated for a second device. The mutual interconnection of the devices can be realized by interconnects on the first side of the carrier substrate. If present, the signal transmission connections may be integrated into one array. These arrays are usually ring-shaped according to the JEDEC-standards of ball grid arrays. The second electric device is preferably a semiconductor device, but may alternatively be a sensor, such as a magnetoresistive sensor, a resonator, such as a bulk acoustic wave resonator, a micro-electromechanical system (MEMS) element, etcetera These and other aspects of the device and the carrier substrate of the invention will be further explained with reference to the Figures, in which:

Figure 1:
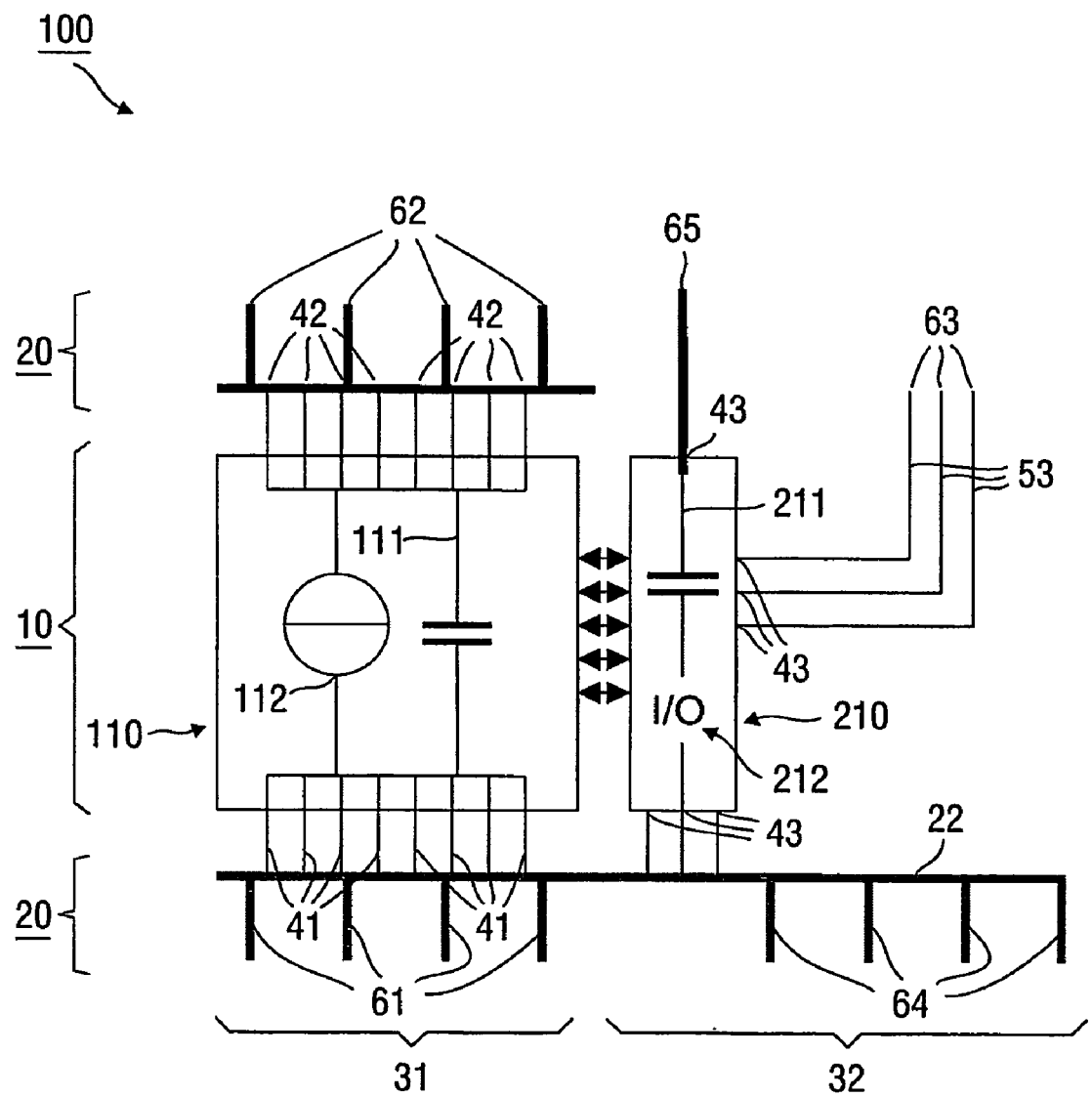
FIG. 1 shows a diagram of the device of the present invention.

The Figures are not drawn to scale and equal reference numerals refer to similar or equal parts. The Figures show one preferred embodiment, but many modifications hereof will be apparent to the skilled person.

FIG. 1 is a graph in which the device 100 of the present invention is depicted. The device 100 comprises a semiconductor device 10, which in this case is an integrated circuit The semiconductor 10 comprises a core functionality 110 and a peripheral functionality 210. The device 100 further comprises a carrier substrate 20, that is provided with a core area 31 and a peripheral area 32. The core functionality 110 comprises the active elements 112 as well as a decoupling capacitor 111, and is provided with voltage supply connections 42 and ground connections 41. By means of the supply decoupling topology with the core decoupling, the contribution to ground bounce, i.e. RF emission from the core can be reduced effectively.

The peripheral functionality 210 comprises I/O means 212 and means for tuning 211, in this case a decoupling capacitor placed in series with the I/O means 212. The peripheral functionality 210 is further provided with connections 43, for voltage supply, ground and signal transmission. The ground connections 41, 43 of the peripheral and the core functionality 110,210 are interconnected through an interconnect 22 in the carrier substrate 20. The decoupling capacitor 211 is used here to stabilize the behaviour. The carrier substrate 20 further comprises contact pads 61, 62, 63, 64, 65 for connections to a printed circuit board.

Figure 2:
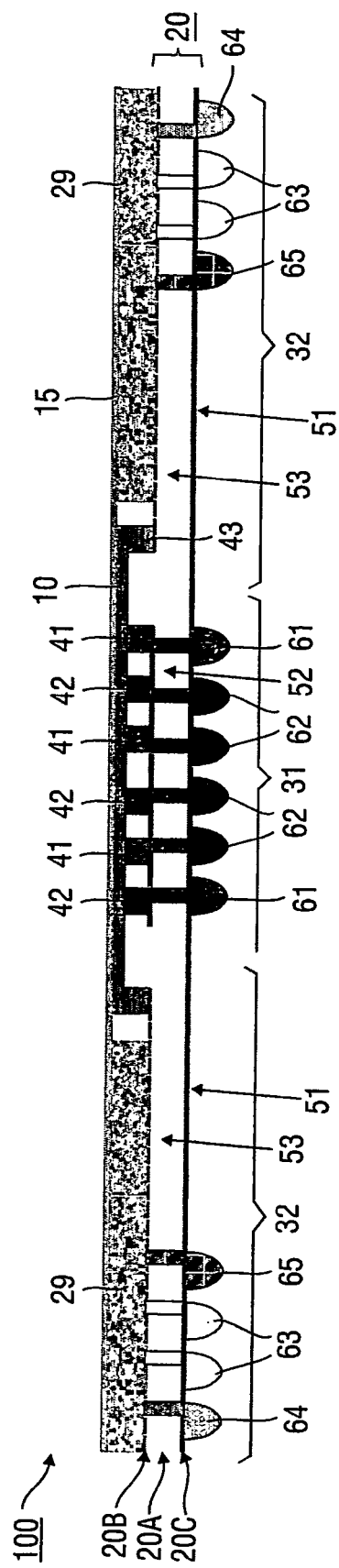
FIG. 2 shows diagramatically a cross-sectional view of the device.
Figure 3:
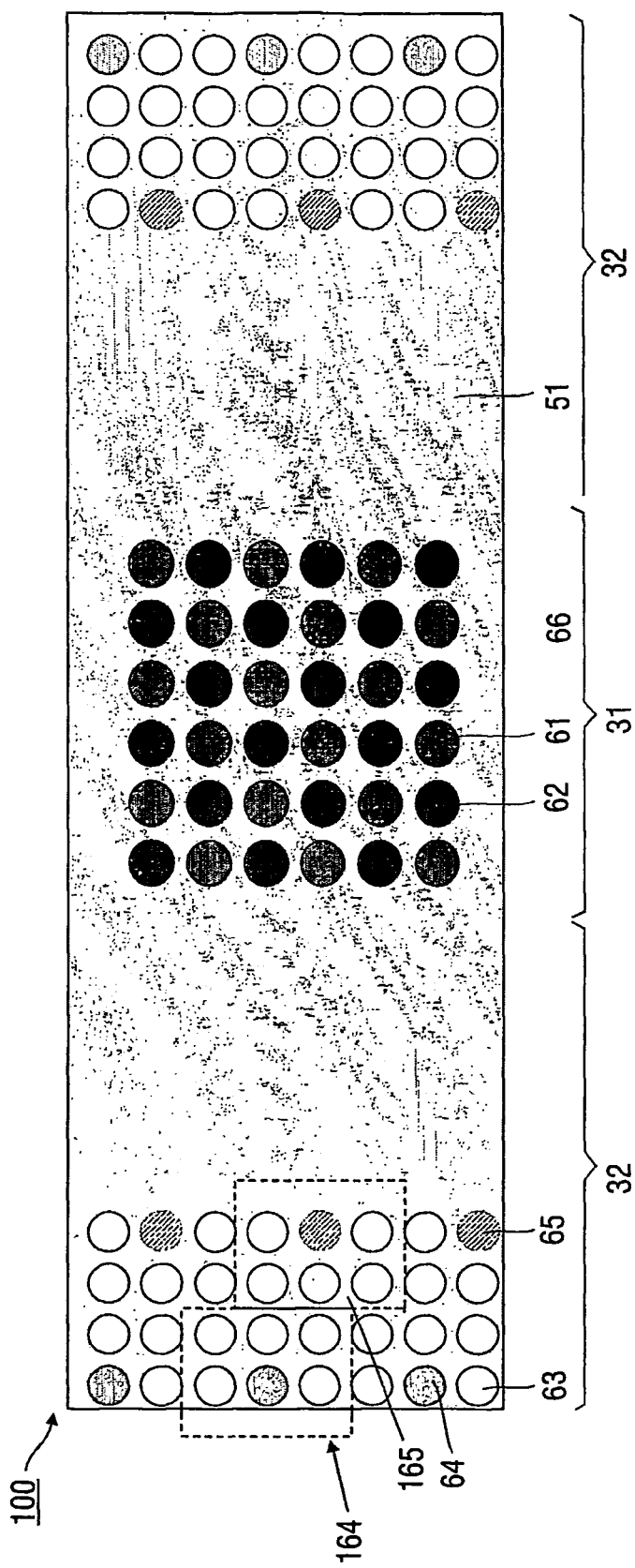
FIG. 3 shows diagramatically a bottom view of the device.
Figure 4:
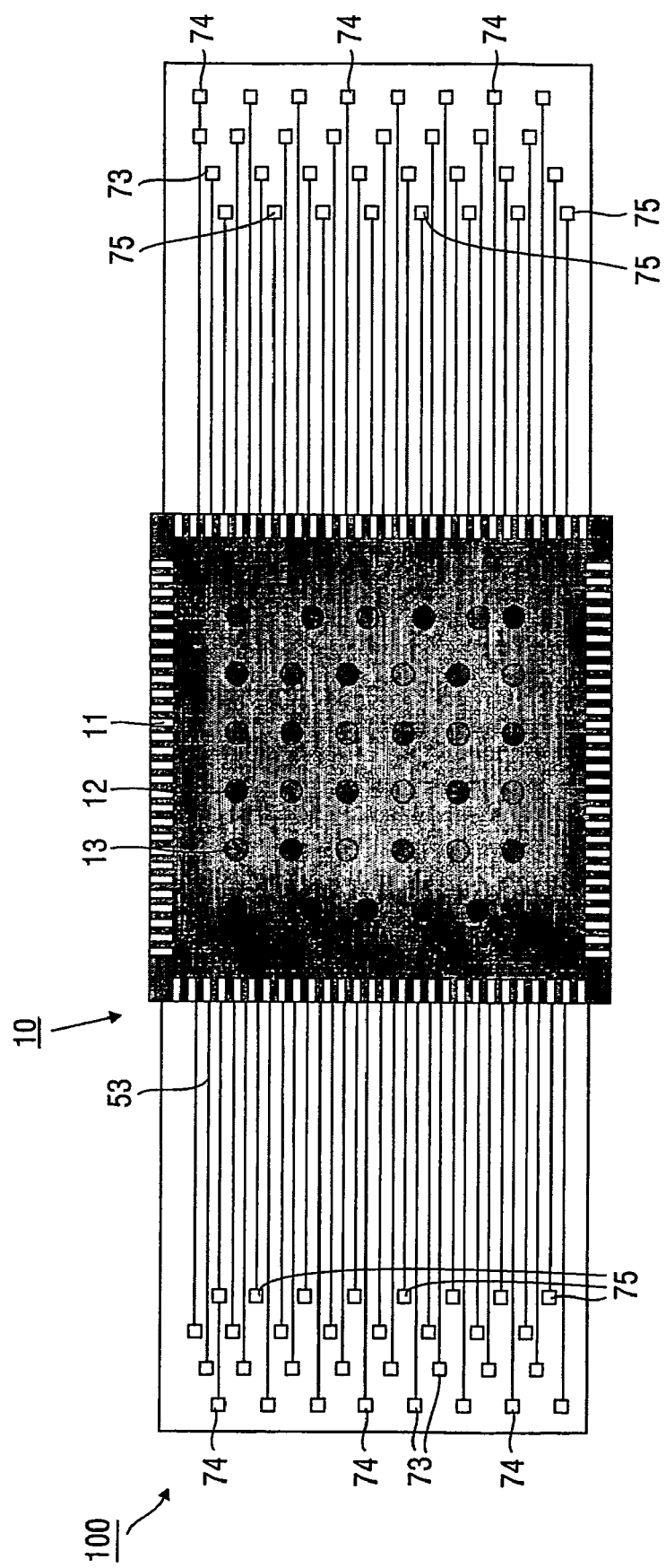
FIG. 4 shows diagramatically a top view of the device.

FIG. 2 shows a cross-sectional view of an embodiment of the device 100 of the invention. FIG. 3 shows the device 100 of this embodiment from the second side of the carrier substrate 20, on which the contact pads 61 to 65 for external connection are present. FIG. 4 shows the device from the first side of the carrier substrate 20. The layout of the integrated circuit 10 is shown as if it were transparent, and shows the side 18 with bond pads 11 to 13. It is observed that in FIGS. 3 and 4 only part of the substrate is shown; the substrate usually extends laterally, and the contact pads 63 to 65 generally form a closed ring around the integrated circuit. Consequently, the embodiment is an example of a typical ball grid array package, as the skilled person will understand. Such a package is preferred, but the invention is not limited thereto. It is furthermore observed that FIG. 2 is not a true cross section, as the skilled person will find out on comparison with FIG. 3.

The device 100 of this embodiment comprises a carrier substrate 20 which is subdivided into a core area 31 and a peripheral area 32. The carrier substrate 20 has a first side 21 and a second side 22. It comprises a body 20A of dielectric material and electrically conducting layers 20B, 20C on the first and second side 21,22 respectively. The dielectric material is in this case an epoxy resin (FR-4) with a thickness of about 80 μm, and the electrically conducting materials are made of copper. The resolution of interconnects and other tracks defined in the copper is in the order of 50 μm and there is a minimal distance between neighbouring tracks of 100 μm, in this embodiment.

The carrier substrate 20 is provided here with a ground plane 51 on the second side 22 of the substrate, extending in the peripheral area 32, and with interconnects 53, that have a transmission line character. The bond pads 43 for the peripheral functionality are provided near to the edge of the core area 31, such that the transmission lines are well defined and their behaviour not negatively affected by bond wires or the like. On the first side 21 a mechanical stiffening layer 29 is present, which provides additional mechanical stability. The stiffening layer 29 has in this case a thickness of about 300 μm and is made of the same material as the body 20A.

The integrated circuit 10 has a first side 18 on which bond pads 11,12,13 are provided (see FIG. 3). The bond pads 11 are those of the first portion intended for ground connection. The bond pads 12 are those of the second portion intended for voltage supply connection. The bond pads 13 include those of the third portion intended for signal transmission. In this embodiment, in which the integrated circuit is provided with core functionality 110 and peripheral functionality 210, the bond pads 13 are also used for the provision of voltage supply and ground connections of the peripheral functionality 210. The bond pads 11,12 are distributed evenly over the available surface area of the integrated circuit 10, according to a chessboard pattern. Assembly on the carrier substrate 20 results in a direct path from the bond pads 11,12 to the corresponding contact pads and solder balls on the second side of the carrier substrate 20.

The integrated circuit in the invention is provided with core functionality and with peripheral functionality. In the invention, separate areas are defined in the carrier substrate 20 for each of the functionalities: a core area 31 for the core functionality and a peripheral area 32 for the peripheral functionality. In the embodiment, the peripheral area 32 is positioned laterally around the core area 31. This is preferred, but not necessary. Specific bond pads are present on the first side 21 of the carrier substrate 20 for the core functionality (42) and the peripheral functionality (43). The bond pads for the peripheral functionality 43 include the bond pads for signal transmission and voltage supply. The bond pads for the core functionality 42 include the bond pads for the voltage supply. In addition, there are bond pads for ground connections (41).

The core area 31 and the peripheral area 32 of the carrier substrate 20 are designed differently. In the core area 31, the bond pads 41,42 on the first side 21 are directly connected to the second side 22, so as to minimize inductive losses. The contact pads 61 for ground connection are positioned directly below the corresponding bond pads 41. In order to have a ground that is as standardized as possible, the bond pads 41 for ground are interconnected through a ground plane 52 on the first side 21 of the carrier substrate 20. The contact pads 62 for voltage supply connection are coupled to the corresponding bond pads 42 through interconnects 67 on the second side 22 of the carrier substrate 20 to the vertical interconnects 66.

The peripheral area 32 of the carrier substrate 20 is provided with a ground plane 51 on its second side 22. On the first side 21 interconnects 53 are defined, so as to connect the bond pads 43 with corresponding contact pads 63, 65. Due to the presence of the ground plane 51 on the second side 22, and a mutual distance between neighbouring interconnects 53 that is preferably larger than the thickness of the body 20A, the interconnects 53 behave as transmission lines. As a result, their inductive losses are reduced by at least 90%, and generally even about 95%.

The interconnects 53 end up at vertical interconnects 73, 75, as shown in FIG. 4. The interconnects 75 correspond to the contact pads 65 for voltage supply connections of the peripheral functionality. The interconnects 73 correspond to the contact pads 63 used for signal transmission. Additionally, there are also contact pads 64 for ground connections of the peripheral area 32. These contact pads 64 are connected to their bond pads 41 through the ground plane 51 on the second side 22 of the carrier substrate 20. The contact pads 64 for ground are positioned at the outer periphery of the contact pads array, generally a ball grid array. This provides some protection against electromagnetic inference.

Some of the contact pads 65 meant for voltage supply connections could be used for ground connections. This is a matter of design and depends on the required number of voltage supply connections and ground connections to an external carrier. It is however preferred that the contact pads 63 to 65 are subdivided into subgroups 164, 165. In the subgroups 164,165 up to eight contact pads 63 for signal transmission are present around a center contact pad 64, 65 that is either a pad for ground or for voltage supply. In this manner a signal path and its signal return can be neighbouring, and hence the distance between both is minimal. This enforces a proper transmission path for the carrier substrate 20 to an external carrier.

This embodiment with the flip-chip orientation of the semiconductor device 10 to the carrier substrate 20 has substantial advantages. First of all, there is no need for an additional bond pad layer on the first side 21 of the carrier substrate 20, which is needed for the wirebonding. There is no need for a redistribution layer (i.e. through the interconnects 66, 67) or a staggered pad array either. The solder balls between the bond pads 11,12, 13 of the integrated circuit and the bond pads 41, 42, 43 at the carrier substrate 20 can be provided directly on the electrically conductive layer 20B.

Secondly, both contact pads 61,62, as well as the corresponding bond pads 41,42 and 11,12 are arranged in a 'chessboard'-pattern. In such a pattern each closest neighbour of a pad for voltage supply 12,42,62 is a pad for ground 11,41,61 and vice versa Consequently, the ball grid array has a coaxial structure, with a reduction of the effective inductance of about 50%, and a lower ground-bounce voltage. The bond pads 11,12 at the integrated circuit 10 are here provided in an inner area These pads 11,12 demonstrate—seen in perpendicular projection on the substrate of the integrated circuit—an overlap with the active region. Such a design of bond pads is also known as bond pads on active areas. They may be provided on top of a passivation layer, in order to provide sufficient strength.

Thirdly, due to the good conductivity (low impedance, low losses) of the interconnect of the core voltage supply in the carrier substrate, the number of ESD protection structures can be reduced. In fact, they are needed only at the outer edge of the core area 31. This is based on the insight that the voltage gradient in the core area 31 shall be minimal during ESD stress, as a consequence of the good conductivity. For the ground connections, ESD protection structures are needed in the core area 31 and in the peripheral area 32.

Fourthly, the thermal management of the device 100 can be improved in that a heat spreading layer 15 is provided on the first side 21 of the carrier substrate and the backside of the integrated circuit 10, e.g. the side facing away from the bond pads 11-13. It is particularly preferred that the semiconductor substrate of the integrated circuit 10 is thinned, thereby reducing the path of thermal resistance to the heat spreading layer 15.

The invention claimed is:

1. An electronic device comprising:
   a semiconductor device provided with a plurality of bond pads, of which bond pads a first portion is defined for ground connection and a second portion is defined for voltage supply and a third portion is defined for signal transmission, and
   a carrier substrate comprising a layer of dielectric material and having a first side and an opposed second side, the first side and the opposed second side are each provided with an electrically conductive layer, on which first side bond pads are present corresponding to the bond pads of the semiconductor device, and on which second side contact pads for external coupling are provided, the contact pads and the bond pads being electrically interconnected according to a desired pattern, the contact pads being subdivided into a first, a second and a third portion corresponding to the portions of bond pads of the semiconductor device, the first and second portions of the bond pads being present laterally in an inner area and the third portion being present in an outer area laterally around the inner area, wherein
   the semiconductor device is coupled to the carrier substrate in a flip-chip orientation, and
   the bond pads and the contact pads for voltage supply and ground connection are located correspondingly, so as to provide a direct path from the contact pads at the second side of the substrate to the corresponding bond pads of the semiconductor device, and
   the pads of the first and second portions are arranged such that at least one direct path dedicated to voltage supply connection acts as a coaxial center conductor.

2. An electronic device as claimed in claim 1, wherein the bond pads of the first and second portion form a joint array, having an edge and an inner area, and the bond pads of the second portion at the edge are provided with ESD protection structures, the bond pads of the second portion in the inner area being free of such ESD protection structures.

3. An electronic device as claimed in claim 2, wherein the pads for ground and supply connection are arranged according to a chessboard pattern.

4. An electronic device as claimed in claim 1, wherein a layer of dielectric material extends from the first to the second side in the substrate.

5. An electronic device as claimed in claim 1, characterized in that the bond pads of the third portion and the corresponding contact pads for external coupling are interconnected through:
  interconnects defined in the conductive layer on the first side of the carrier substrate, and
  vertical interconnects through the carrier substrate which, in the case of perpendicular projection on the conductive layer on the second side, have a substantial overlap with the contact pads for signal transmission.

6. An electronic device as claimed in claim 5, characterized in that
  a ground plane is defined in the conductive layer on the second side of the carrier substrate,
  the mutual distance between the interconnects and the dielectric thickness of the carrier substrate are chosen such that the interconnects have transmission line characteristics.

7. An electronic device comprising:
  a semiconductor device provided with a plurality of bond pads, a first portion of the pond pads defined for ground connection, a second portion of the bond pads defined for voltage supply and a third portion of the bond pads defined for signal transmission; and
  a carrier substrate including a layer of dielectric material, the carrier substrate having a first side and an opposed second side and a mechanical stiffener layer on the first side of the carrier substrate, the first side and the second side each provided with an electrically conductive layer, on the first side of the carrier substrate bond pads are present corresponding to the bond pads of the semiconductor device, and on the second side of the carrier substrate contact pads for external coupling are provided, the contact pads and the bond pads being electrically interconnected according to a desired pattern, the contact pads being subdivided into a first, a second and a third portion corresponding to the portions of bond pads of the semiconductor device, the first and second portions of the bond pads being present laterally in an inner area and the third portion being present in an outer area laterally around the inner area, wherein
  the semiconductor device is coupled to the carrier substrate in a flip-chip orientation, and
  the bond pads and the contact pads for voltage supply and ground connection are located correspondingly, so as to provide a direct path from the contact pads at the second side of the substrate to the corresponding bond pads of the semiconductor device, and
  the pads of the first and second portions are arranged such that at least one direct path dedicated to voltage supply connection acts as a coaxial center conductor.

8. An electronic device comprising:
  a semiconductor device provided with a plurality of bond pads, a first portion of the pond pads defined for ground connection, a second portion of the bond pads defined for voltage supply and a third portion of the bond pads defined for signal transmission; and
  a carrier substrate including a layer of dielectric material, the carrier substrate having a first side and an opposed second side and a spacer layer on the first side of the carrier substrate, the spacer layer covered by a heat dissipation layer, the heat dissipation layer in thermal contact with the semiconductor device at a face thereof opposite to the face including the bond pads, the first side and the opposed second side each provided with an electrically conductive layer, on the first side of the carrier substrate bond pads are present corresponding to the bond pads of the semiconductor device, and on the second side of the carrier substrate contact pads for external coupling are provided, the contact pads and the bond pads being electrically interconnected according to a desired pattern, the contact pads being subdivided into a first, a second and a third portion corresponding to the portions of bond pads of the semiconductor device, the first and second portions of the bond pads being present laterally in an inner area and the third portion being present in an outer area laterally around the inner area, wherein
  the semiconductor device is coupled to the carrier substrate in a flip-chip orientation, and
  the bond pads and the contact pads for voltage supply and ground connection are located correspondingly, so as to provide a direct path from the contact pads at the second side of the substrate to the corresponding bond pads of the semiconductor device, and
  the pads of the first and second portions are arranged such that at least one direct path dedicated to voltage supply connection acts as a coaxial center conductor.

9. An electronic device as claimed in claim 8, wherein the heat dissipation layer is connected thermally to a heat sink at the carrier substrate.

10. An electronic device comprising:
  a semiconductor device provided with a plurality of bond pads, a first portion of the pond pads defined for ground connection, a second portion of the bond pads defined for voltage supply and a third portion of the bond pads defined for signal transmission;
  a carrier substrate including a layer of dielectric material and having a first side and an opposed second side, the first side and the second side each provided with an electrically conductive layer, on the first side of the carrier substrate bond pads are present corresponding to the bond pads of the semiconductor device, and on the second side of the carrier substrate contact pads for external coupling are provided, the contact pads and the bond pads being electrically interconnected according to a desired pattern, the contact pads being subdivided into a first, a second and a third portion corresponding to the portions of bond pads of the semiconductor device, the first and second portions of the bond pads being present laterally in an inner area and the third portion being present in an outer area laterally around the inner area, wherein
  the semiconductor device is coupled to the carrier substrate in a flip-chip orientation, and
  the bond pads and the contact pads for voltage supply and ground connection are located correspondingly, so as to provide a direct path from the contact pads at the second side of the substrate to the corresponding bond pads of the semiconductor device, and
  the pads of the first and second portions are arranged such that at least one direct path dedicated to voltage supply connection acts as a coaxial center conductor; and
  a second semiconductor device that is provided with a direct path for ground and voltage supply connection from its bond pads to the second side of the carrier substrate, on which second side contact pads for ground and voltage supply connection are present.

11. A carrier substrate comprising a layer of dielectric material and having a first side and an opposed second side, the first side and the opposed second side are each provided with an electrically conductive layer, on the first side bond pads for coupling to bond pads of a semiconductor device are present, and on the second side contact pads for external coupling are provided, the contact pads and the bond pads being electrically interconnected according to a desired pattern, the bond pads being subdivided into a first portion for voltage supply connection, a second portion for ground connection and a third portion for signal transmission, the first and second portions of the bond pads being present laterally in an inner area and the third portion being present in an outer area laterally around the inner area, wherein the first and second portions of the bond pads jointly make up an array, which array extends to the contact pads on the second side of the carrier substrate, so as to form a direct path, and the pads for ground connection and for supply connection are arranged in the array such that each of the pads for supply connection has pads for ground connections as its closest neighbour pads.

* * * * *